United States Patent [19]

Gollinger

[11] Patent Number: 4,712,021
[45] Date of Patent: Dec. 8, 1987

[54] CMOS INVERTER

[75] Inventor: Wolfgang Gollinger, Gundelfingen, Fed. Rep. of Germany

[73] Assignee: Deutsche ITT Industries GmbH, Freiburg, Fed. Rep. of Germany

[21] Appl. No.: 879,353

[22] Filed: Jun. 27, 1986

[30] Foreign Application Priority Data

Jun. 28, 1985 [DE] Fed. Rep. of Germany .................... 85108065[U]

[51] Int. Cl.$^4$ .................... H03K 5/24; H03K 19/017; H03K 19/094
[52] U.S. Cl. .................................... 307/355; 307/263; 307/443; 307/451
[58] Field of Search ............... 307/263, 350, 355, 530, 307/443, 451, 448, 475, 473, 469

[56] References Cited

U.S. PATENT DOCUMENTS 4,477,741  10/1984  Moser, Jr. ..................... 307/443

Primary Examiner—John Zazworsky
Attorney, Agent, or Firm—T. L. Peterson

[57] ABSTRACT

An inverter has two transistors driven via two capacitors. The dc operating point of the transistors are set by means of currents derived from the output currents of a reference current source. This gives identical delays for the positive and negative pulse edges of the input signal, so that, in a preferred application together with a differential amplifier used as a voltage camparator, a good high-frequency response is achieved in the range from 10 to 20 MHz.

12 Claims, 2 Drawing Figures

CMOS INVERTER

BACKGROUND OF THE INVENTION

The present invention relates to an inverter implemented in CMOS technology, i.e., with complementary insulated-gate field-effect transistors.

DE No. A 30 08 280 corresponding to U.S. Pat. No. 4,309,665 describes an inverter comprising two transistors, namely a p-channel transistor and an n-channel transistor. The controlled current paths of the two transistors are connected in series between the positive and negative terminals of a supply-voltage source. The junction point of the controlled current paths form the inverter output. The gate of the n-channel transistor is connected to the inverter input through a first capacitor. The n-channel transistor is the output transistor of a first current mirror. The gate of the p-channel transistor is connected directly to the inverter input and through a high-value resistor to the inverter output.

In the prior art inverter, the direct-current operating points of the two transistors are set with the input signal which is capacitively coupled to the transistors. Therefore, the lower cutoff frequency is determined by the time constant of the capacitive coupling. Furthermore, after the passage of a pulse, the output of the inverter assumes the state in which its level is equal to about half the supply voltage, uless another pulse edge follows within the time determined by the time constant. The prior art inverter thus has no stable outlet level corresponding to the input signal having passed through it.

SUMMARY OF THE INVENTION

It is, therefore, one object of the invention to improve the prior art inverter so that, on the one hand, the lower cutoff frequency is lowered without any increase in resistance and/or capacitance values, while, on the other hand, switching times at high frequencies are not increased, and that one of the two binary levels at the output is constantly present even in the absence of input signals.

This offers the advantage that on both leading and trailing edges of an input signal, the steepness of the output-pulse edges is correspondingly symmetrical, so that on leading and trailing edges, the signal delays within the inverter are as equal as possible.

An inverter in accordance with the invention can be used to advantage as the output stage of a differential amplifier serving as a voltage comparator, because differences in the signal delays or rising and trailing pulse edges are very small even if different voltage differences exist at the comparator inputs.

BRIEF DESCRIPTION OF THE DRAWING

The invention will be better understood from a reading of the following detailed description in conjunction with the drawing in which.

DETAILED DESCRIPTION

Figure 1:
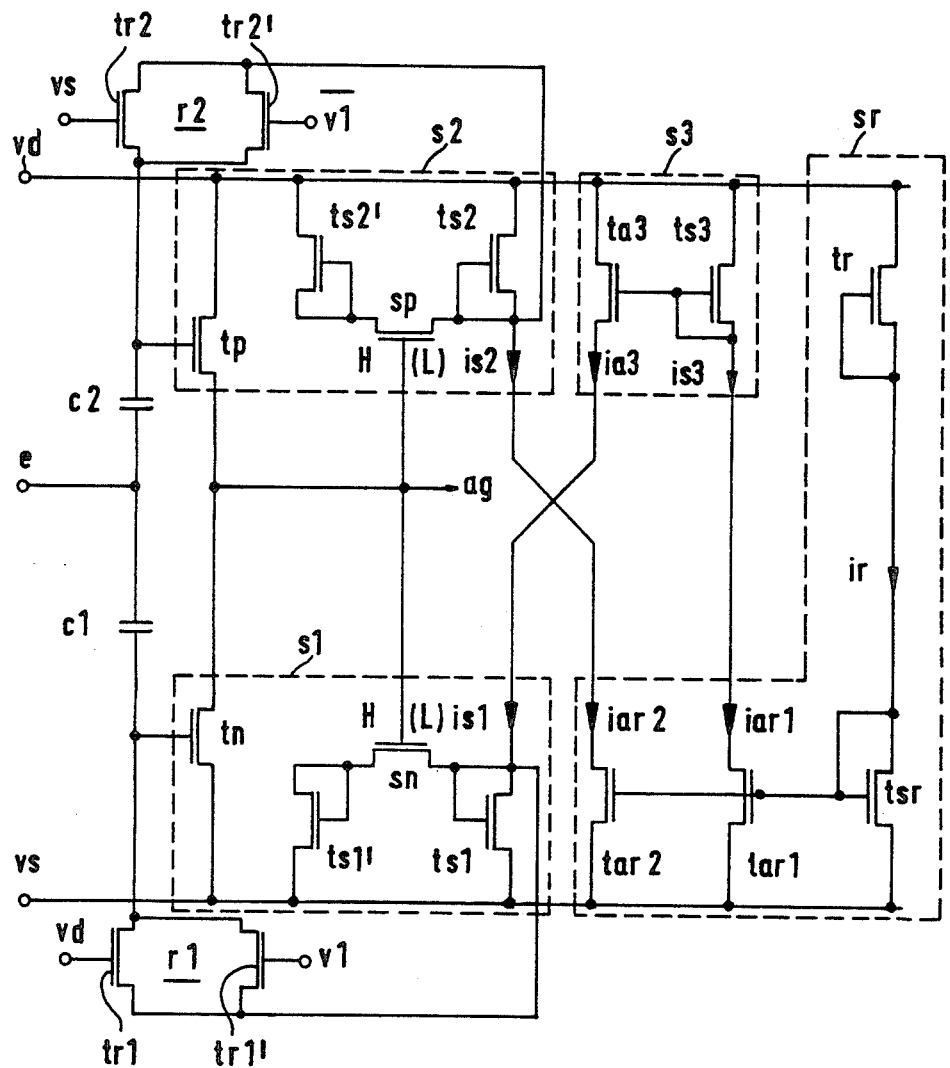
FIG. 1 is a circuit diagram of an embodiment of the invention.

Referring to FIG. 1, the two transistors of the inverter, namely the p-channel transistor tp and the n-channel transistor tn, have their controlled current paths connected between the positive terminal vd and the negative terminal vs of the supply-voltage source. Connected between the inverter input e and the gates of the two transistors are the first capacitor c1 and the second capacitor c2, respectively, so that the p-channel transistor is driven only capacitively, too.

The operating points of the two transistors tp, tn are set with the first, second, and third current mirrors s1, s2, and s3 and with the reference current mirror sr. The first and second current mirrors s1, s2 are switchable between a high and a low current value by the output signal of the inverter. This switching is effected so with a logic high or H level at the inverter output ag, the first current mirror can carry the low current value, and the second current mirror the high current value, whereas with inverter output ag at a logic low or L level, these conditions are reversed. In the static state, only the low current value flows in the inverter, but this enables the current mirror switched to the high current value to supply the necessary charge exchange current on an input-pulse transition.

Through the switching between the high and low current values, the output level caused by an edge of the input signal is maintained regardless of the time until the next edge, so that even input signals of relatively low frequency are permitted.

In the circuit diagram of FIG. 1, the switching between the high and low current values is effected by two transistors in each current mirror which have the same channel width-to-length ratio (=w/l ratio) and are connected to a switching transistor sp, sn having its gate coupled to the inverter output ag. Since, in current mirrors, the ratio between drive current and ouput current is equal to the relation of the w/l ratios of the driver transistor and the output transistor, the current mirrors s1, s2 are switched to the low current value when the respective switching transistor sp, sn is on, so that the two driver transistors in each current mirror are connected in parallel. Consequently, the high current value flows when the switching transistors are off. As is usual with current mirrors, the gate of the driver transistor is connected directly to the associated source.

The drive current is1 for the first current mirror s1 is the output current ia3 of the third current mirror s3, and the drive current is3 for the latter is the first output current iar1 of the reference current mirror sr. The drive current is2 for the second current mirror s2 is the second output current iar2 of the reference current mirror sr. The value of the reference current ir can be chosen via the transistor tr, which is connected as a resistor. The sum point of the reference current mirror sr is connected to the terminal vs of the supply-voltage source, and the sum point of the third current mirror s3 is connected to the supply terminal vd.

The drive currents flow in the drive transistors ts1, ts1', ts2, ts2', ts3, tsr, and the output currents in the output transistors ta3, tar1, tar2, tp, tn.

In a preferred embodiment, the w/l ratios of all current-mirror transistors are chosen so that the high current value of the first current mirror s1 is equal to twice the low current value of this current mirror, and that all currents of the other current mirrors are equal to the low current value. In the static state, without an input signal, the reference current ir thus flows in the series arrangement of the two transistors tp, tn. Furthermore, the w/l ratios of the two parallel-connected transistors ts1, ts1' in the first current mirror s1 and the two parallel-connected transistors ts2, ts2' in the second current mirror s2 are equal. The gate of the n-channel transistor tn and that of the p-channel transistor tp are connected via the first resistor r1 and the second resistor r2 to the drive inputs of the first current mirror s1 and second current mirror s2, respectively, and thus also to the outputs of the third current mirror and the reference current mirror, respectively.

According to an advantageous aspect of the invention, the first resistor r1 and the second resistor r2 are formed by an additional n-channel transistor tr1 and an additional p-channel transistor tr2, respectively. The controlled current path of the n-channel transistor tr1 is the connection between the gate of the first transistor tn and the first current mirror s1, and the controlled current path of the p-channel transistor tr2 is the connection between the gate of the second transistor tp and the second current mirror s2. The gates of these transistors are connected, respectively, to the positive and negative terminals vd, vs of the supply-voltage source.

According to a further advantageous aspect of the invention, the current path of each of the additional transistors tr1, tr2 is shunted by the current path of a parallel transistor tr1', tr2' of the same conductivity type, with the differentiated output signal v1 being applied to the gate of the n-channel parallel transistor tr1', and the inverted differentiated output signal $\overline{v1}$ to the gate of the p-channel parallel transistor tr2', and the differentiation time constant being shorter than the input-pulse duration to be processed. With such an arrangement, particularly at high input-signal frequencies (10 MHz to 20 MHz), the inverter returns to its static operating point faster than if only the additional transistors tr1, tr2 were present.

Figure 2:
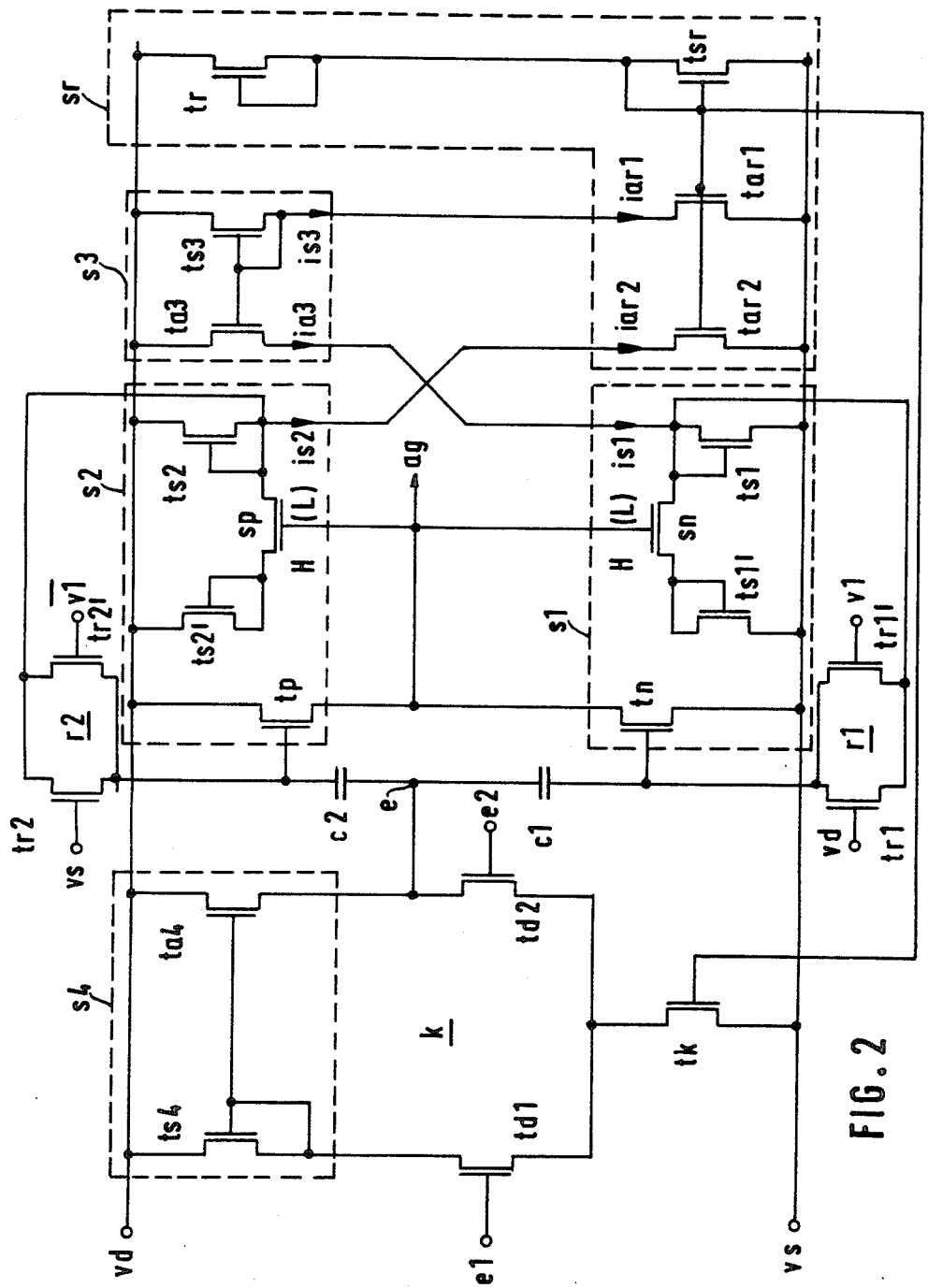
FIG. 2 is a circuit diagram showing the invention used together with a differential amplifier serving as a voltage comparator.

FIG. 2 is a circuit diagram illustrating the above-mentioned preferred use of the inverter of FIG. 1 together with a differential amplifier k serving as a voltage comparator. The differential amplifier k consists of the differential-amplifier transistors td1, td2, whose source terminals are connected to the terminal vs of the supply-voltage source via the common transistor tk, which is used as a constant current source and has its gate connected to the interconnected gates of the transistors of the reference current source sr. The gate of the differential-amplifier transistor td1 forms the first comparator input e1, and that of the differential-amplifier transistor td2 the second comparator input e2. The two load resistors of the differential amplifier are formed by the drive transistor ts4 and the output transistor ta4 of the fourth current mirror s4, with the controlled current path of the drive transistor ts4 connected in series with that of the differential-amplifier transistor td1, and the controlled current path of the output transistor ta4 connected in series with that of the differential-amplifier transistor td2. The output is formed by the junction point between the two last-mentioned transistors ta4, td2 and is connected to the two capacitors c1, c2.

Different voltage differences at the two inputs e1, e2 cause only slight differences in the delays of the two possible pulse edges. This is particularly important if an arrangement as shown in FIG. 2 is to be operated at frequencies between 10 and 20 MHz as a converter that changes a tri-state digital signal into a binary signal.

What is claimed is:
1. An inverter comprising:
an inverter input terminal;
an inverter output terminal;
a first current mirror having an output transistor taking the form of an n-channel CMOS second transistor having a gate and a controlled current path, said first current mirror having a drive input;
a second current mirror having an output transistor taking the form of a p-channel CMOS first transistor having a gate and a controlled current path, said second current mirror having a drive input;
means for connecting to a voltage source, said controller current paths of said first and second transistors being connected in series between positive and negative terminals of said means for connecting to a voltage source and having a junction therebetween;
said inverter output terminal being connected to said junction between the controlled current paths of said first and second transistors to provide an output signal of said inverter;
a first capacitor connecting said input terminal to the gate of said first transistor;
a second capacitor connecting said input terminal to the gate of said second transistor;
a third current mirror having a drive input and a first current output, said first current output of said third current mirror being connected for providing drive current to said first current mirror drive input;
a reference current mirror having a second current output, said second current output of said reference current mirror being connected for providing drive current to said third current mirror, and having a third current output connected for providing drive current to said second current mirror;
first resistor means coupling the gate of said n-channel CMOS second transistor to said first current mirror drive input; and
second resistor means coupling the gate of said p-channel CMOS first transistor to said second current mirror drive input;
wherein output currents of said first and second current mirrors are switched between a high and low current value depending on output levels of said inverter such that said first current mirror has a low output current value when said output level is a first level and has a high output current value when said output level is a second level, while said second current mirror has a high output current value when said output level is said first level and has a low output current value when said output level is said second level.

2. An inverter in accordance with claim 1, wherein:
said high output current values of said first and second current mirrors are each equal to twice the low output current values of the respective current mirrors; and
the drive currents supplied at said third current mirror first current output and said reference current mirror second and third current outputs are each equal to said low current values.

3. An inverter in accordance with claim 1, wherein:
said first resistor means comprises a CMOS n-channel third transistor having a gate and a controlled current path, said controlled current path of said CMOS n-channel third transistor being connected between the gate of said second transistor and said first current mirror drive input, the gate of said third transistor being connected to said positive terminal;
said second resistor means comprises a CMOS p-channel fourth transistor having a gate and a controlled current path, said controlled current path of said CMOS p-channel fourth transistor being connected between the gate of said first transistor and said second current mirror drive input, the gate of said fourth transistor being connected to said negative terminal.

4. An inverter in accordance with claim 3, comprising:
a CMOS n-channel fifth transistor having a gate and a current path, said current path of said CMOS n-channel fifth transistor being connected in shunt with said third transistor current path, the gate of said fifth transistor receiving said output signal of said inverter differentiated with a time constant shorter than the input pulse duration to be processed; and
a CMOS p-channel sixth transistor having a gate and a current path, said current path of said CMOS p-channel sixth transistor being connected in shunt with said fourth transistor current path, the gate of said sixth transistor receiving an inverted form of said differentiated inverter output signal.

5. An inverter in accordance with claim 2, wherein:
said first resistor means comprises a CMOS n-channel third transistor having a gate and a controlled current path, said controlled current path of said CMOS n-channel third transistor being connected between the gate of said second transistor and said first current mirror drive input, the gate of said third transistor being connected to said positive terminal;
said second resistor means comprises a CMOS p-channel fourth transistor having a gate and a controlled current path, said controlled current path of said CMOS p-channel fourth transistor being connected between the gate of said first transistor and said second current mirror drive input, the gate of said fourth transistor being connected to said negative terminal.

6. An inverter in accordance with claim 5, comprising:
a CMOS n-channel fifth transistor having a gate and a current path, said current path of said CMOS n-channel fifth transistor being connected in shunt with said third transistor current path, the gate of said fifth transistor receiving said output signal of said inverter differentiated with a time constant shorter than the input pulse duration to be processed; and
a CMOS p-channel sixth transistor having a gate and a current path, said current path of said CMOS p-channel sixth transistor being connected in shunt with said fourth transistor current path, the gate of said sixth transistor receiving an inverted form of said differentiated inverter output signal.

7. A voltage comparator comprising:
a differential amplifier; and
an output stage comprising:
an inverter input terminal;
an inverter output terminal;
a first current mirror having an output transistor taking the form of an n-channel CMOS second transistor having a gate and a controlled current path, said first current mirror having a drive input;
a second current mirror having an output transistor taking the form of a p-channel CMOS first transistor having a gate and a controlled current path, said second current mirror having a drive input;
means for connecting to a voltage source, said controlled current paths of said first and second transistors being connected in series between positive and negtive terminals of said means for connecting to a voltage source and having a junction therebetween;
said inverter output terminal being connected to said junction between the controlled current paths of said first and second transistors to provide an output signal of said inverter;
a first capacitor connecting said input terminal to the gate of said first transistor;
a second capacitor connecting said input terminal to the gate of said second transistor;
a third current mirror having a drive input and a first current output, said first current output of said third current mirror being connected for providing drive current to said first current mirror drive input;
a reference current mirror having a second current output, said second current output of said reference current mirror being connected for providing drive current to said third current mirror, and having a third current output connected for providing drive current to said second current mirror;
first resistor means coupling the gate of said n-channel CMOS second transistor to said first current mirror drive input; and
second resistor means coupling the gate of said p-channel CMOS first transistor to said second current mirror drive input;
wherein output currents of said first and second current mirrors are switched between a high and low current value depending on output levels of said inverter such that said first current mirror has a low output current value when said output level is a first level and has a high output current value when said output level is a second level, while said second current mirror has a high output current value when said output level is said first level and has a low output current value when said output level is said second level.

8. A voltage comparator in accordance with claim 7, wherein:
said high output current values of said first and second current mirrors are each equal to twice the low output current values of the respective current mirrors; and
the drive currents supplied at said third current mirror first current output and said reference current mirror second and third current outputs are each equal to said low current values.

9. A voltage comparator in accordance with claim 7, wherein:
said first resistor means comprises a CMOS n-channel third transistor having a gate and a controlled current path, said controlled current path of said CMOS n-channel third transistor being connected between the gate of said second transistor and said first current mirror drive input, the gate of said third transistor being connected to said positive terminal;
said second resistor means comprises a CMOS p-channel fourth transistor having a gate and a controlled current path, said controlled current path of said CMOS p-channel fourth transistor being connected between the gate of said first transistor and said second current mirror drive input, the gate of said fourth transistor being connected to said negative terminal.

10. A voltage comparator in accordance with claim 9, comprising:
- a CMOS n-channel fifth transistor having a gate and a current path, said current path of said CMOS n-channel fifth transistor being connected in shunt with said third transistor current path, the gate of said fifth transistor receiving said output signal of said inverter differentiated with a time constant shorter than the input pulse duration to be processed; and
- a CMOS p-channel sixth transistor having a gate and a current path, said current path of said CMOS p-channel sixth transistor being connected in shunt with said fourth transistor current path, the gate of said sixth transistor receiving an inverted form of said differentiated inverter output signal.

11. A voltage comparator in accordance with claim 8, wherein:
said first resistor means comprises a CMOS n-channel third transistor having a gate and a controlled current path, said controlled current path of said CMOS n-channel third transistor being connected between the gate of said second transistor and said first current mirror drive input, the gate of said third transistor being connected to said positive terminal;
said second resistor means comprises a CMOS p-channel fourth transistor having a gate and a controlled current path, said controlled current path of said CMOS p-channel fourth transistor being connected between the gate of said first transistor and said second current mirror drive input, the gate of said fourth transistor being connected to said negative terminal.

12. A voltage comparator in accordance with claim 11, comprising:
- a CMOS n-channel fifth transistor having a gate and a current path, said current path of said CMOS n-channel fifth transistor being connected in shunt with said third transistor current path, the gate of said fifth transistor receiving said output signal of said inverter differentiated with a time constant shorter than the input pulse duration to be processed; and
- a CMOS p-channel sixth transistor having a gate and a current path, said current path of said CMOS p-channel sixth transistor being connected in shunt with said fourth transistor current path, the gate of said sixth transistor receiving an inverted form of said differentiated inverter output signal.

* * * * *